(12) United States Patent
Dimitrakopoulos et al.

(10) Patent No.: US 8,476,617 B2
(45) Date of Patent: Jul. 2, 2013

(54) GRAPHENE-CONTAINING SEMICONDUCTOR STRUCTURES AND DEVICES ON A SILICON CARBIDE SUBSTRATE HAVING A DEFINED MISCUT ANGLE

(75) Inventors: Christos D. Dimitrakopoulos, Baldwin Place, NY (US); Alfred Grill, White Plains, NY (US); Timothy J. McArdle, Mahopac, NY (US); John A. Ott, Greenwood Lake, NY (US); Robert L. Wisnierff, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 13/030,834

(22) Filed: Feb. 18, 2011

(65) Prior Publication Data

US 2012/0211723 A1    Aug. 23, 2012

(51) Int. Cl.
*H01L 29/08* (2006.01)
*H01L 21/20* (2006.01)

(52) U.S. Cl.
USPC ............ 257/29; 257/E51.006; 257/E51.038; 438/478; 977/734

(58) Field of Classification Search
USPC ......................................... 977/734, 844, 842
See application file for complete search history.

(56) References Cited

U.S. PATENT DOCUMENTS

| | | | |
|---|---|---|---|
| 2009/0236608 A1* | 9/2009 | de Heer et al. | 257/77 |
| 2010/0051960 A1* | 3/2010 | Chen et al. | 257/76 |
| 2012/0112164 A1* | 5/2012 | Chu et al. | 257/14 |

OTHER PUBLICATIONS

Virojanadara et al. "Substrate orientation: A way towards higher quality monolayer graphene growth on 6H-SiC(0001)", published online May 22, 2009, Surface Science Letters 603 (2009) L87-L90.*
Borysiuk et al. "Transmission electron microscopy and scanning tunneling microscopy investigations of graphene on 4H-SiC(0001)" published online Jan. 21, 2009, Journal of Applied Physics 105, 023503 (2009), pp. 023503-1 to 023503-5.*
Tanaka, S. et al., Anisotropic layer-by-layer growth of graphene on vicinal SiC(0001) surfaces, Physical Review B, 2010, pp. 041406-1 to 041406-4, vol. 81, issue 4.

* cited by examiner

*Primary Examiner* — Calvin Lee
*Assistant Examiner* — Scott Stowe
(74) *Attorney, Agent, or Firm* — Scully, Scott, Murphy & Presser, P.C.; Louis J. Percello, Esq.

(57) ABSTRACT

A semiconductor structure having a high Hall mobility is provided that includes a SiC substrate having a miscut angle of 0.1° or less and a graphene layer located on an upper surface of the SiC substrate. Also, provided are semiconductor devices that include a SiC substrate having a miscut angle of 0.1° or less and at least one graphene-containing semiconductor device located atop the SiC substrate. The at least one graphene-containing semiconductor device includes a graphene layer overlying and in contact with an upper surface of the SiC substrate.

16 Claims, 7 Drawing Sheets

GRAPHENE-CONTAINING SEMICONDUCTOR STRUCTURES AND DEVICES ON A SILICON CARBIDE SUBSTRATE HAVING A DEFINED MISCUT ANGLE

STATEMENT OF GOVERNMENT INTEREST

The present disclosure was made with Government support under Contract No.: FA8650-08-C-7838 awarded by the Defense Advanced Research Projects Agency (DARPA). The Government thus has certain rights to this disclosure.

BACKGROUND

The present application relates to a semiconductor structure including a semiconductor device and a method of fabricating the same. More particularly, the present application relates to a semiconductor structure and a semiconductor device both including graphene that is epitaxially grown on a silicon carbide (SiC) substrate having a miscut angle of 0.1° or less.

Several trends presently exist in the semiconductor and electronics industry including, for example, devices are being fabricated that are smaller, faster and require less power than the previous generations of devices. One reason for these trends is that personal devices such as, for example, cellular phones and personal computing devices, are being fabricated that are smaller and more portable. In addition to being smaller and more portable, personal devices also require increased memory, more computational power and speed. In view of these ongoing trends, there is an increased demand in the industry for smaller and faster transistors used to provide the core functionality of the integrated circuits used in these devices.

Accordingly, in the semiconductor industry there is a continuing trend toward fabricating integrated circuits (ICs) with higher densities. To achieve higher densities, there has been, and continues to be, efforts toward down scaling the dimensions of the devices on semiconductor wafers generally produced from bulk silicon. These trends are pushing the current technology to its limits. In order to accomplish these trends, high densities, smaller feature sizes, smaller separations between features, and more precise feature shapes are required in integrated circuits (ICs).

Significant resources go into down scaling the dimensions of devices and increasing packing densities. For example, significant time may be required to design such down scaled transistors. Moreover, the equipment necessary to produce such devices may be expensive and/or processes related to producing such devices may have to be tightly controlled and/or be operated under specific conditions. Accordingly, there are significant costs associated with exercising quality control over semiconductor fabrication.

In view of the above, the semiconductor industry is pursuing graphene to achieve some of the aforementioned goals. Graphene, which is essentially a flat sheet of carbon atoms, is a promising material for radio frequency (RF) transistors and other electronic transistors. Typical RF transistors are made from silicon, alloys of Si, e.g., SiGe, or more expensive semiconductors such as, for example, indium phosphide (InP).

SUMMARY

The applicants of the present application have investigated the structure and electrical properties of graphene grown on "on-axis" SiC(0001) substrates having miscut angles ranging from 0 to 0.45°. The applicants unexpectedly found through the investigation that graphene grown on pit-free surfaces with narrow terraces (substrate miscut angles above 0.28°), showed substantially lower Hall mobility than graphene grown on surfaces with miscut angles of 0.1° or below that have wider terraces but contain some pits. The applicants have also unexpectedly determined that the effect of pits on graphene mobility is not detrimental, assuming the flat areas between pits or between pits and terrace edges are larger than the carrier mean free path. The term "miscut angle" as used throughout the present application denotes an angle relative to a perfectly on-axis hexagonal (0001) SiC wafer surface; a perfectly on-axis SiC wafer has a miscut angle of 0.0°.

In one aspect, a semiconductor structure having a room temperature Hall mobility (of about 1900 $cm^2/(V \cdot s)$ or greater) is provided. The semiconductor structure having such a high Hall mobility includes a SiC substrate having a miscut angle of 0.1° or less and a graphene layer located on an upper surface of the SiC substrate.

In another aspect, a semiconductor device having the aforementioned room temperature Hall mobility is provided that includes a SiC substrate having a miscut angle of 0.1° or less and at least one graphene-containing semiconductor device located atop the SiC substrate. The at least one graphene-containing semiconductor device includes a graphene layer overlying and in contact with an upper surface of the SiC substrate.

In a further aspect, a method of forming the semiconductor structure and device is provided. The method includes selecting a SiC substrate having a miscut angle of 0.1° or less; and forming a graphene layer on an upper surface of the SiC substrate. A graphene-containing semiconductor device can be formed using at least a portion of the graphene layer as an element of the device.

BRIEF DESCRIPTION OF THE DRAWINGS

FIGS. 4A-4C include SiC substrates having a miscut angle that is outside the scope of the present disclosure, while FIGS. 4D, 4E and 4F include SiC substrates having a miscut angle that is within the scope of the present disclosure.

DETAILED DESCRIPTION

Figure 1:
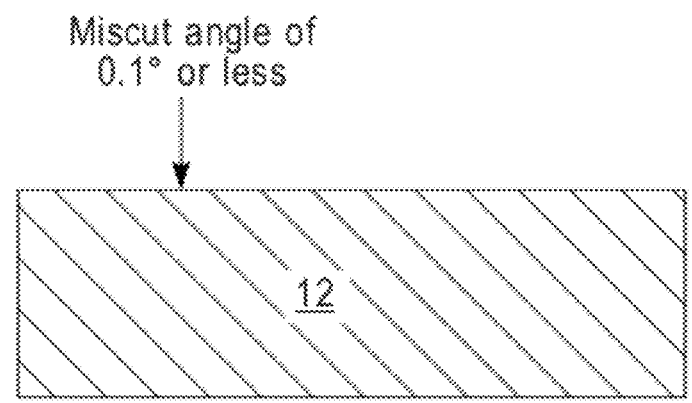
FIG. 1 is a pictorial representation (through a cross sectional view) depicting a SiC substrate having a miscut angle of 0.1° or less in accordance with an embodiment of the present disclosure.

The present disclosure, which relates to a semiconductor structure including graphene that is epitaxially grown on a silicon carbide (SiC) substrate having a miscut angle of 0.1° or less, will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As mentioned above, the applicants of the present application have unexpectedly found that graphene grown on pit-free surfaces with narrow terraces (substrate miscut angles above 0.28°), showed substantially lower Hall mobility than graphene grown on surfaces with miscut angles of 0.1° or less that have wider terraces but contain some pits. The applicants have also unexpectedly determined that the effect of pits on graphene mobility is not detrimental, assuming the flat areas between pits or between pits and terrace edges are larger than the carrier mean free path.

One of the factors that have often been considered detrimental to graphene performance is the presence of pits on the graphenized SiC surface. The terrace edges of a vicinal SiC surface have been shown to be sites of enhanced Si desorption, nucleation of buffer layer ($6\sqrt{3}\times6\sqrt{3}\cdot R30$ phase), and graphene formation. Pits are formed on SiC during buffer formation, when a new source of C atoms is needed to cover a surface area located far from a straight terrace edge. A newly formed pit acts as a source of C. This indicates that narrower terraces should reduce pit formation, as the reduced terrace width lies within the diffusion limits (at the used graphenization temperatures and time scales) of C atoms originating at the edge. In such case, C atoms do not need to diffuse far to join the edge of an existing graphene nucleus.

"On-axis" SiC substrates are commercially available with surfaces unintentionally miscut by up to 0.5°. The applicants of the present application investigated the structure and properties of graphene grown on such substrates having miscut angles ranging from 0° to 0.45°, to determine (i) if a particular miscut angle could produce higher graphene mobility, (ii) the effect of pits or lack thereof on graphene mobility, and, (iii) if it was possible to eliminate a potentially serious variability factor for graphene performance. The latter had previously impeded efforts to optimize the graphene growth and hence graphene performance. In view of applicants' investigations, it was determined that graphene formed on SiC having a miscut angle of 0.1° or less provided improved electrical properties, than graphene grown on SiC having a miscut angle above 0.1°. This result is quite unexpected since graphene grown on SiC having a miscut angle of 0.1° or less is grown over several pits on the terraces, contrary to graphene grown on SiC having a miscut angle above 0.1° that shows very few pits or no pits at all.

Figure 2:
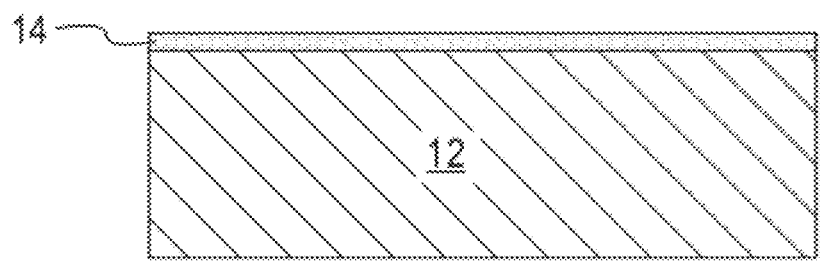
FIG. 2 is a pictorial representation (through a cross sectional view) depicting the structure of FIG. 1 after epitaxially growing a graphene layer on an upper surface of the SiC substrate.

Reference is now made to FIGS. 1-2 which illustrate basic processing steps that can be employed in one embodiment of the present application. Specifically, FIG. 1 is an illustration of a SiC substrate 12 having a miscut angle of 0.1° or less, i.e., 0.0° (i.e., perfectly on axis SiC wafer), 0.01°, 0.02°, 0.03°, 0.04°, 0.05°, 0.06°, 0.07°, 0.08°, 0.09° or 0.1°. In one embodiment of the present application, the SiC substrate 12 has a miscut angle from 0.0° to 0.03°. In other embodiments, the SiC substrate can have any other range between 0.0° and 0.1°.

The SiC substrate 12 (which can also be referred to as a SiC wafer) that can be used in the present application is commercially available and can be purchased from any well known wafer supplier. Some examples of suppliers who sell SiC wafers that can have a miscut angle of 0.1° or less include, but are not limited to, Cree Inc. and II-VI Inc.

In one embodiment of the present application, the SiC substrate 12 is a vicinal 6 H(0001) SiC (i.e., a surface corresponding to the Si face of a crystal with hexagonal unit cell comprising 6 Si—C bilayers in the c-direction), or 4H SiC substrate (i.e., a surface corresponding to the Si face of a crystal with hexagonal unit cell comprising 4 Si—C bilayers in the c-direction). By "vicinal" it is meant that due to the slight miscut angle (below 0.5°) the SiC substrate 12 has a surface that deviates from a major crystallographic axis, and for accommodating such deviation, terraces of the 0001 crystallographic plane are formed, followed by a step usually, but not always, 3 or 2 bilayers high.

The SiC substrate 12 employed in the present application having a miscut angle of 0.1° or less has a vicinal surface. During graphenization, pits form on the SiC vicinal surface. The lower the miscut angle and the higher the terrace width, the larger the number of pits. The density of the pits present in the SiC substrate 12 employed in the present application after graphene formation, is typically less than 5 pits/$\mu m^2$ assuming that the pits lie on a hexagonal grid with n.n. pit distance of 0.5 $\mu m$. More typically, the SiC substrate 12 employed in the present application can have a pit density from 0 pits/$\mu m^2$ to 5 pits/$\mu m^2$. The SiC substrate 12 can also have other pit densities besides the ranges mentioned herein so long at the value is less than 5 pits/$\mu m^2$.

The terraces that can be present in the SiC substrate 12 have an average vicinal terrace width of at least 0.005 $\mu m$, depending on the miscut angle of the wafer, with an average vicinal terrace width of at least 0.50 $\mu m$ being more typical.

Referring now to FIG. 2, there is illustrated the structure of FIG. 1 after forming a graphene layer 14 on an upper surface of the SiC substrate 12. The term "graphene" as used throughout the present application denotes a one-atom-thick planar sheet of $sp^2$-bonded carbon atoms that are densely packed in a honeycomb crystal lattice. The graphene employed as graphene layer 14 has a two-dimensional (2D) hexagonal crystallographic bonding structure. The graphene that can be employed as graphene layer 14 can be comprised of single-layer graphene (nominally 0.34 nm thick), few-layer graphene (2-10 graphene layers), multi-layer graphene (>10 graphene layers), a mixture of single-layer, few-layer, and multi-layer graphene, or any combination of graphene layers mixed with amorphous and/or disordered carbon phases. The graphene employed as graphene layer 14 can also include, if desired, substitutional, interstitial and/or intercalated dopant species as well.

The graphene layer 14 that is formed on the upper surface of the SiC substrate 12 can be formed by first cleaning the upper surface of the SiC substrate 12 by performing a first anneal in a dilute silane-containing ambient. The first anneal that can be used to clean the upper surface of the SiC substrate 12 is typically performed at a temperature from about 800° C. up to, but not beyond the melting point of silicon in a dilute silane-containing ambient, with a first anneal temperature from 810° C. to 1250° C. being more typical. The first anneal in a dilute silane-containing ambient can be done at two different temperatures, typically at 810° C. and 1140° C. The anneal techniques mentioned in forming the graphene layer 14 can also be referred to as an epitaxial growth process. As such, the graphene layer 14 has an epitaxial relation to the SiC substrate 12.

As mentioned above, the first anneal is performed in a dilute silane-containing ambient. By "silane-containing ambient" it is meant any atmosphere that includes at least one compound of hydrogen and silicon that has the general formula $Si_nH_{2n+2}$ wherein n is any integer, particularly n is from 1 to 2. Examples of silanes that can be employed within the silane-containing ambient include, but are not limited to, silane, disilane and mixtures thereof. Alternatively, a beam of evaporated Si atoms can play the role of the cleaning agent. By 'cleaning', it is meant the removal of $SiO_2$ to more volatile SiO that leaves the surface, and the conversion of non-carbidic C to Si—C.

The silane-containing ambient is typically diluted with an inert gas including for example, at least one of He, Ne, Ar, Kr and Xe. In one embodiment, the content of silane within the dilute silane-containing ambient is typically from 2% to 100% based on the total amount of the dilute silane-containing ambient. In another embodiment, the content of silane within the dilute silane-containing ambient is 20% based on the total amount of the dilute silane-containing ambient.

After performing the first anneal, a second anneal is performed that grows graphene on the upper surface of the SiC substrate 12. The second anneal is typically performed in an inert ambient or in vacuum and at a temperature from 1400° C. to 1650° C., with a second anneal temperature from 1450° C. to 1550° C. being more typical. By "inert ambient" it is meant a gas including at least one of He, Ne, Ar, Kr and Xe. In one embodiment of the present application, the second anneal is performed in Ar. During the second anneal, silicon is released from the upper surface of the SiC substrate 12 forming a graphene layer 14 thereon.

In some embodiments of the present application, an intermediate anneal is performed between the first and second anneals. When an intermediate anneal is performed, the intermediate anneal is performed in another dilute silane-containing ambient and at an intermediate temperature that is between the temperature of the first anneal, and the temperature of the second anneal. The another dilute silane-containing ambient may be the same or different than the dilute silane-containing ambient used in the first anneal. The intermediate temperature is typically from 1050° C. to 1250° C., depending on the silane concentration in the reactor, with an intermediate anneal temperature from 1100° C. to 1200° C. being more typical.

In some embodiments of the present application, the first anneal and the optional intermediate anneal can be omitted and the graphene layer 14 is formed by only annealing at a temperature from 1400° C. to 1600° C. in an inert ambient. In one embodiment of the present application, this 'sole' anneal can be performed in Ar.

Notwithstanding the technique employed in forming the graphene layer 14, the graphene layer 14 that is formed has a thickness that is typically within a range from 0.34 nm to 2 nm, with a thickness from 0.34 nm to 0.68 nm being more typical (one to two graphene monolayers).

Applicants have determined that devices including the structure shown in FIG. 2 have a room-temperature Hall mobility of about 1000 $cm^2/(V·s)$ to 1900 $cm^2/(V·s)$ or greater, (considering the surfaces also contain pits). By 'room-temperature' it is meant a temperature between 20° C. to 30° C. More typically, devices including the structure shown in FIG. 2 can have a room temperature Hall mobility of 500 $cm^2/(V·s)$ to 1450 $cm^2/(V·s)$.

Figure 3A:
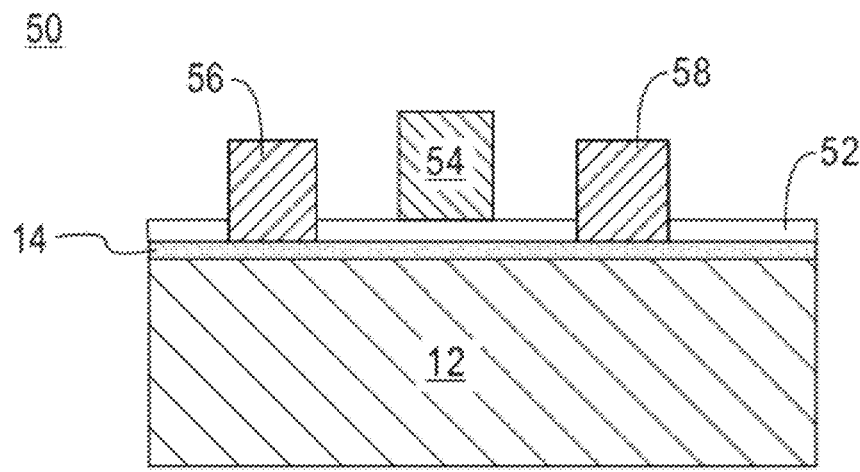
FIGS. 3A-3C are pictorial representations (through cross sectional views) depicting various graphene-containing semiconductor devices that can be formed using the structure of FIG. 2.
Figure 3B:
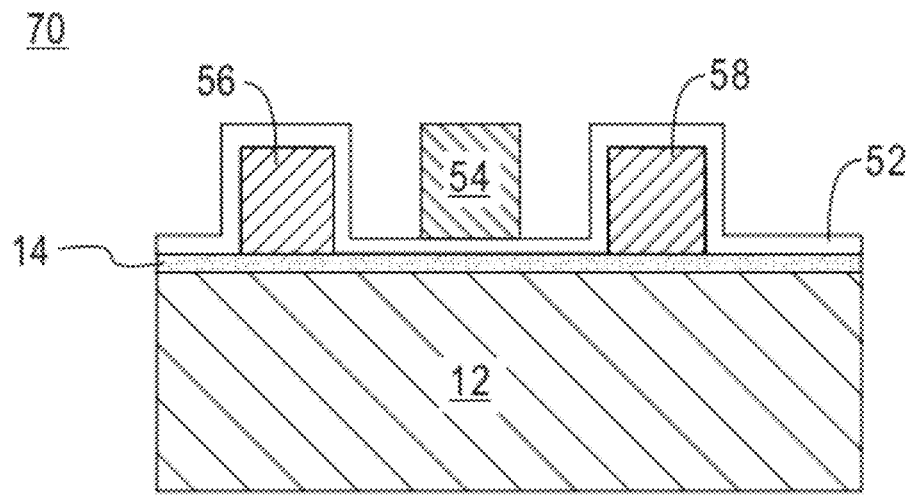
Figure 3C:
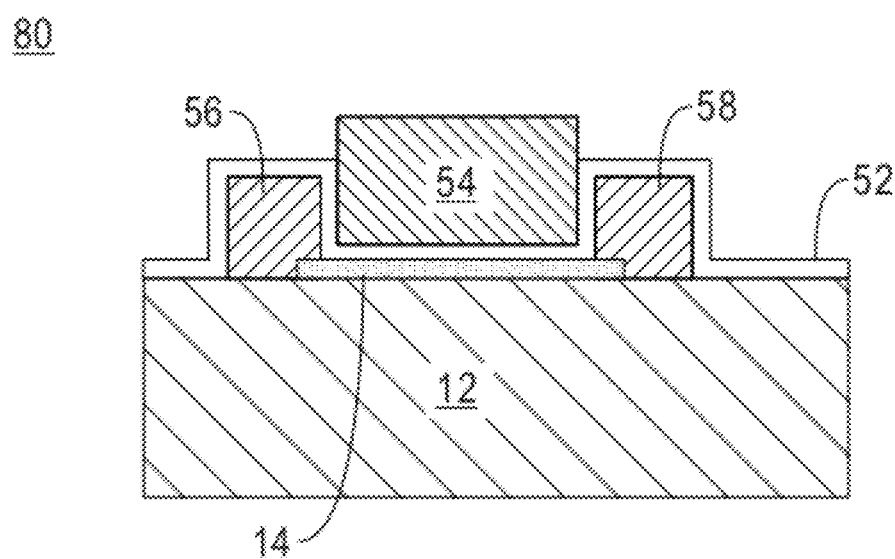

The structure shown in FIG. 2 can be used as an intermediate structure for forming at least one graphene-containing semiconductor device. FIGS. 3A-3C illustrate some examples of graphene-containing semiconductor devices that can be formed, which include the graphene layer 14 of the structure shown in FIG. 2 as an element of the semiconductor device. For example and when the semiconductor device is a field effect transistor (FET), at least a portion of the graphene layer 14 can serve as the device's channel. Although FET devices are illustrated and described in detail herein below, the present application is not limited to just those types of semiconductor devices. Instead, other semiconductor devices including, but not limited to, diodes, and BiCMOS, can be formed.

The graphene-containing semiconductor device 50 shown in FIG. 3A is formed by first providing the structure shown in FIG. 2. Next, gate dielectric layer 52 is formed on an upper surface of the graphene layer 14. The gate dielectric layer 52 employed can include any insulating material such as for example, an organic polymer, an oxide, a nitride, an oxynitride or a multilayered stack thereof. In one embodiment, the gate dielectric layer 52 can include a semiconductor oxide, a semiconductor nitride or a semiconductor oxynitride. In another embodiment, the gate dielectric layer 52 can include a dielectric metal oxide or mixed metal oxide having a dielectric constant that is greater than the dielectric constant of silicon oxide, i.e., 3.9. Typically, the dielectric material that can be employed as the gate dielectric layer 52 has a dielectric constant greater than 4.0, with a dielectric constant of greater than 8.0 being more typical. Such dielectric materials are referred to herein as high k dielectrics. Exemplary high k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Multilayered stacks of these high k materials can also be employed as the gate dielectric layer 52. Each value of x is independently from 0.5 to 3 and each value of y is independently from 0 to 2.

The thickness of the gate dielectric layer 52 that can be employed may vary depending on the technique used to form the same. Typically, the gate dielectric layer 52 that can be employed has a thickness from 1 nm to 20 nm, with a thickness from 2 nm to 10 nm being more typical.

The gate dielectric layer 52 can be formed by methods well known in the art. In one embodiment, the gate dielectric layer 52 can be formed by a deposition process such as, for example, chemical vapor deposition (CVD), plasma enhanced chemical vapor deposition (PECVD), physical vapor deposition (PVD), molecular beam deposition (MBD), pulsed laser deposition (PLD), liquid source misted chemical deposition (LSMCD), and atomic layer deposition (ALD). If the gate dielectric is a stack of several layers, some of the layers can be deposited by chemical solution deposition or spin-on technique. In one embodiment, the stack can include a layer containing a polyhydroxystyrene based polymer, and an $HfO_2$ layer.

After forming the gate dielectric layer 52, the gate conductor 54 can be formed. The gate conductor 54 includes any conductive material including, but not limited to, polycrystalline silicon, polycrystalline silicon germanium, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) and multilayered combinations thereof. In one embodiment, the conductive material that can be employed as gate conductor 54 can be comprised of an nFET metal gate. In another embodiment, the conductive material that can be employed as gate conductor 54 can be comprised of a pFET metal gate. In a further embodiment, the conductive material that can be employed as gate conductor 54 can be comprised of polycrystalline silicon. The polysilicon conductive material can be used alone, or in conjunction with another conductive material such as, for example, a metal conductive material and/or a metal silicide material.

The conductive material that is employed as gate conductor 54 can be formed utilizing a conventional deposition process including, for example, chemical vapor deposition (CVD), plasma enhanced chemical vapor deposition (PECVD), physical vapor deposition (PVD), sputtering, atomic layer deposition (ALD) and other like deposition processes. When Si-containing materials are used as the conductive material, the Si-containing materials can be doped within an appropriate impurity by utilizing either an in-situ doping deposition process or by utilizing deposition, followed by a step such as ion implantation or gas phase doping in which the appropriate impurity is introduced into the Si-containing material. When a metal silicide is formed, a conventional silicidation process is employed. The as-deposited conductive material typically has a thickness from 1 nm to 100 nm, with a thickness from 3 nm to 30 nm being even more typical.

Following deposition of the conductive material, the conductive material is patterned by lithography into the gate conductor 54.

The semiconductor device 50 further includes source region 56 and drain region 58 that make electrical contact to portions of the graphene layer 14. The source region 56 and the drain region 58 include one of the conductive materials mentioned above for gate conductor 54. The source region 56 and the drain region 58 can be formed by etching an opening in the gate dielectric layer 52, deposition, lithography and etching.

Reference is now made to FIG. 3B which illustrates another graphene-containing semiconductor device 70 that can include the structure shown in FIG. 2. The another semiconductor device 70 includes SiC substrate 12, graphene layer 14, a gate dielectric layer 52, a gate conductor 54 located on a portion of the gate dielectric layer 52, and a source region 56 and a drain region 58 located on an upper surface of the graphene layer 14 and on opposite sides of the gate conductor 54. In this embodiment, a portion of the gate dielectric 52 is located on sidewalls and atop the source region 56 and the drain region 58. The elements of semiconductor device 70, which have like reference numerals as the elements of the semiconductor device 50, include the materials mentioned above. Semiconductor device 70 can be formed similar to the semiconductor device 50 mentioned above except that the source region 56 and drain region 58 are formed prior to forming the gate dielectric layer 52 and the gate conductor 54. In this embodiment, a conventional lift off process can be employed in forming the source region 56 and the drain region 58. Alternatively, the source region 56 and the drain region 58 can be formed by deposition, lithography and etching.

Reference is now made to FIG. 3C which illustrates another graphene-containing semiconductor device 80 that can include the structure shown in FIG. 2. In this embodiment, a portion of the gate dielectric 52 is located on sidewalls and atop the source region 56 and the drain region 58, and the gate conductor 54 is in contact with the sidewalls of the gate dielectric 52 that are present on sidewalls of the source region 56 and the drain region 58. The elements of semiconductor device 80, which have like reference numerals as the elements of the semiconductor device 50, include the materials mentioned above. Semiconductor device 80 can be formed similar to the semiconductor device 50 mentioned above except that the graphene layer 14 is patterned prior to forming the source region 56 and drain region 58.

Example

In this example, graphene was grown on SiC substrates having different miscut angles. All samples were grown in an RF-heated UHV reactor using the same multistep process, i.e., annealing at 810° C. for 10 minutes and 1140° C. for 7 minutes (both under flow of 20% disilane in He), then graphenizing at 1550° C. for 10 minutes under Ar flow at a chamber pressure of 3.5 mTorr.

Figure 4A:
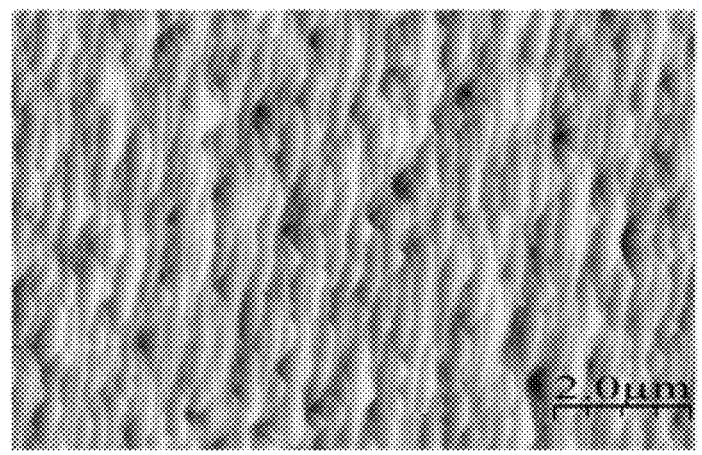
FIGS. 4A-4F are AFM height images showing the dependency of graphene morphology on the miscut angle of various SiC substrates.
Figure 4B:
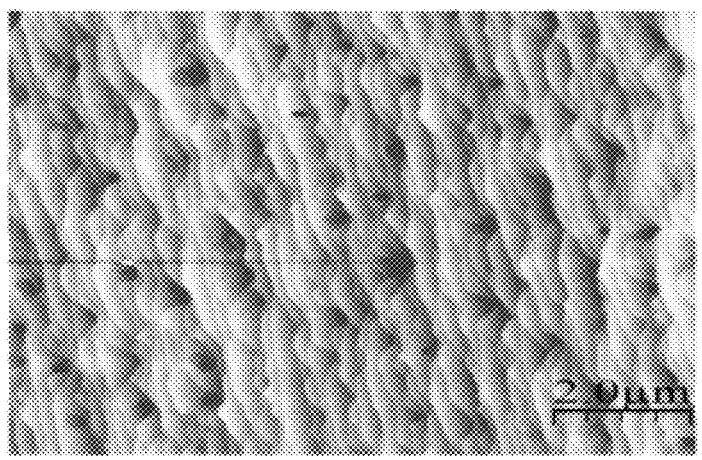
Figure 4C:
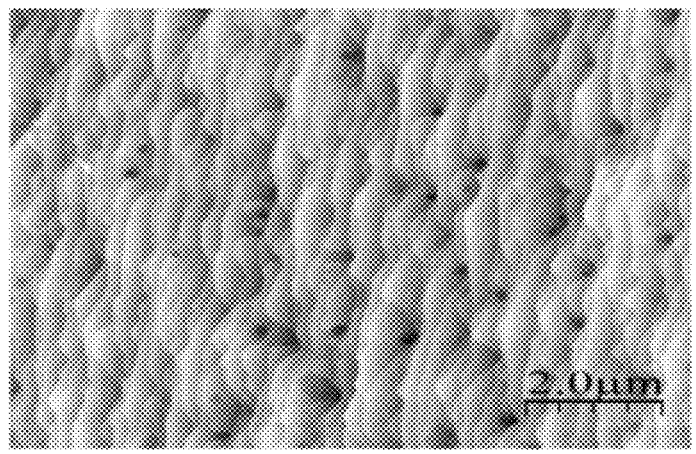
Figure 4D:
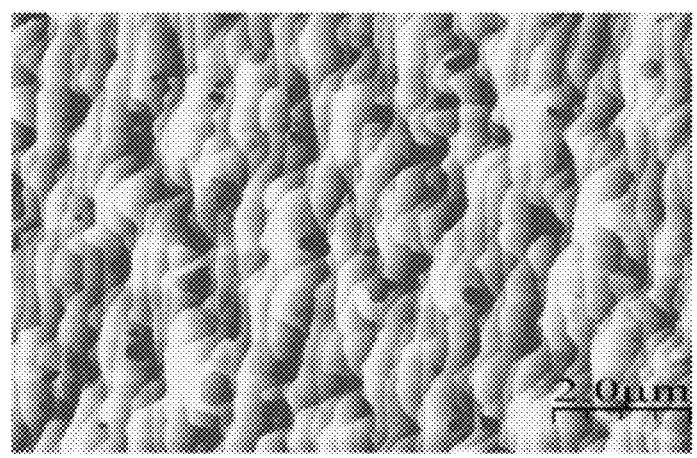
Figure 4E:
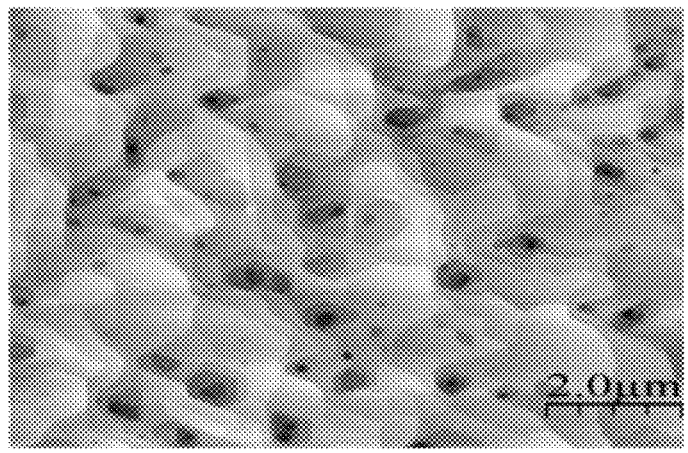
Figure 4F:
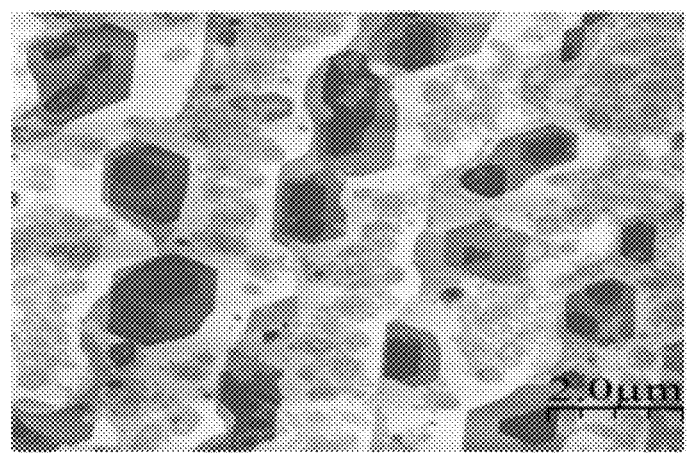

AFM height images (each having a Z-scale of 10 nm) are shown in FIGS. 4A-4F. Specifically, FIGS. 4A-4E correspond to graphene grown on the Si-face of 6 H(0001) semi-insulating (SI) substrates, and FIG. 4F corresponds to graphene grown on the Si-face of a 4 H(0001) high-purity semi-insulating (HPSI) substrate. The miscut angle corresponding to each image is as follows: FIG. 4A=0.45°, FIG. 4B=0.35°, FIG. 4C=0.28°, FIG. 4D=0.10°, FIG. E=0.03°, and FIG. 4F=0.00°. As such, the samples within FIGS. 4D-4F are in accordance with the present application, while samples within FIGS. 4A-4C are outside the scope of the present application.

The width of terraces in each case was inversely proportional to the miscut angle. For miscut angles above 0.28° the surface under graphene was pit-free or minimally pitted. Below 0.10° a higher density of larger and deeper pits appeared. The corresponding phase images (not illustrated) indicated the graphene thickness is 2±1 monolayers (ML). The majority of the SiC surface was covered by 2 ML of graphene, while a $3^{rd}$ ML started forming in some minor areas, and in a few other spots 1 ML graphene was still present.

Large Hall bar devices (200 μm×160 μm) were fabricated by depositing Ti/Pd/Au contacts on top of blanket graphene using optical lithography and lift-off, followed by graphene patterning using another optical lithography step, oxygen RIE, and wet striping of the resist.

Figure 5:
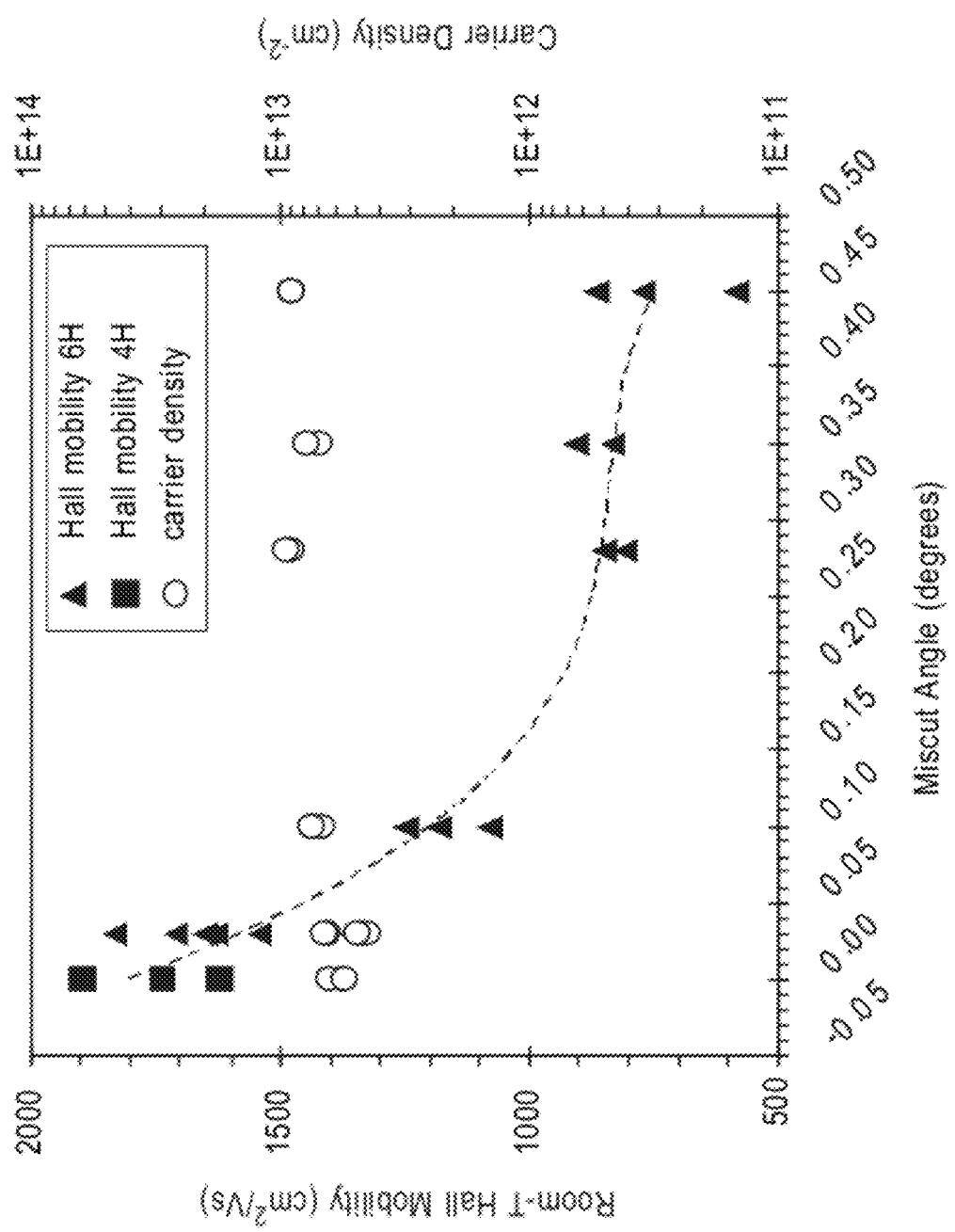
FIG. 5 is a graph depicting room temperature Hall mobility ($cm^2/(V \cdot s)$) vs. SiC miscut angle (degrees).

Hall mobility measurements were performed in a vacuum chamber using magnetic fields ranging from 1 Tesla to −1 Tesla. FIG. 5 shows the room temperature Hall mobility and 2D carrier density vs. substrate miscut angle. The squares correspond to 4 H(0001) SiC, while the triangles correspond to 6 H(0001) SiC. Mobility was low (between 585 and 905 $cm^2/(V·s)$) from 0.45° to 0.28°, but started to increase steeply for miscut angles below 0.1° and reached 1830 $cm^2/(V·s)$ at 0.03°. All the graphene samples were grown 6 H(0001) SiC.

Additionally, graphene on a perfectly on-axis 4 H(0001) substrate (0° miscut) showed even higher Hall mobilities that reached 1900 $cm^2/(V·s)$. The carrier density was fairly similar in all these samples, in the range between 4.6E12 and 9.5E12 $cm^{-2}$. The mobilities increased from the sample in FIG. 4A towards the sample of FIG. 4F. This meant that the unpitted sample FIG. 4A had approximately one third of the mobility of the pitted samples in FIGS. 4E and 4F. It appears that the pits do not have a major negative effect on Hall mobility.

Figure 6:
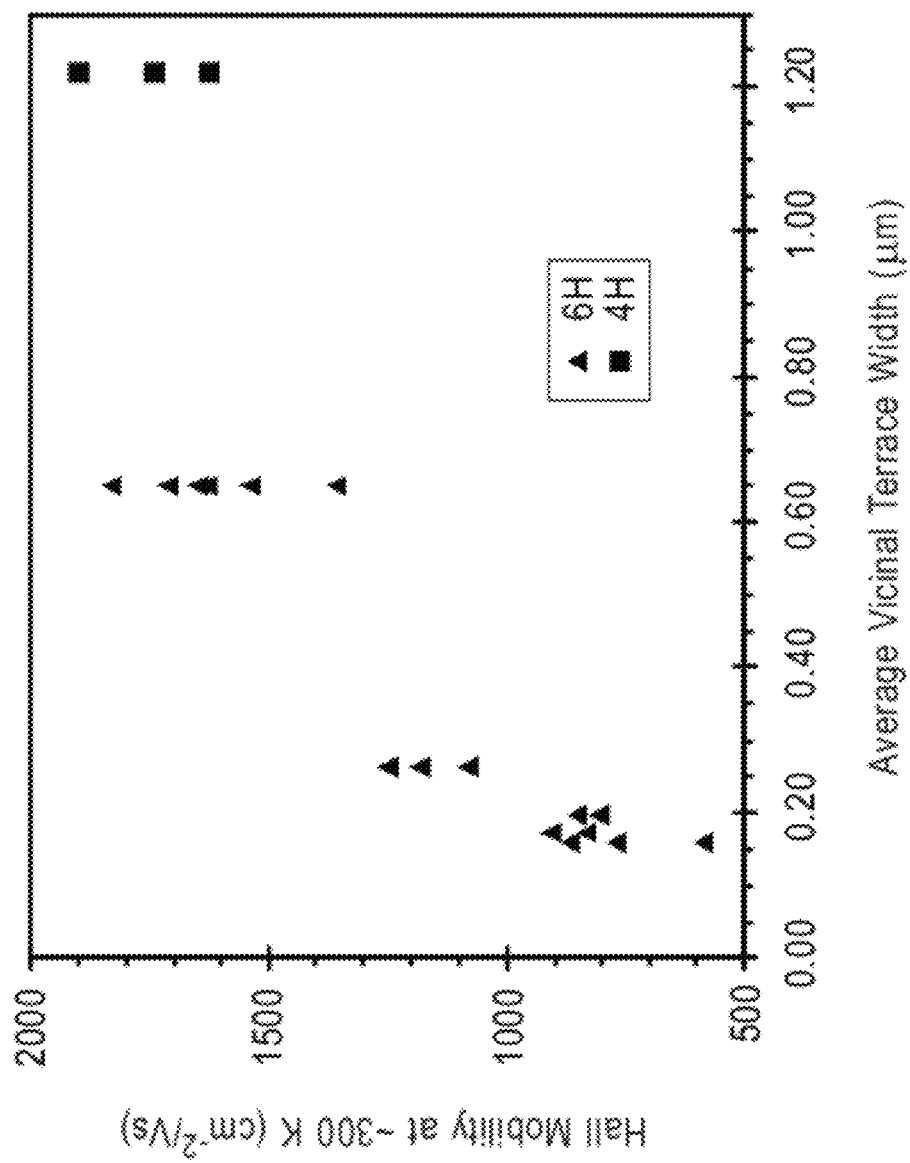
FIG. 6 is a graph depicting Hall mobility at 300 K ($cm^2/(V \cdot s)$) vs. average vicinal terrace width (μm).

FIG. 6 shows the Hall mobility at 300 K ($cm^2/(V·s)$) vs. Average vicinal terrace width (μm) of 6 H SiC and 4 H SiC wafers. The parameters that seem to correlate well with the measured Hall mobility are the miscut angle and the average terrace width of the resulting vicinal surface. The average terrace width along three random AFM scan lines (close to top, middle and bottom of FIGS. 4A-4F) was measured, and the room temperature Hall mobility was plotted against the average of the three measurements 6. An increase in mobility with terrace width was observed.

In order to understand this correlation, one needs to consider the fact that in high quality graphene the electrical transport is ballistic with carrier mean free paths reaching up to approximately 0.5 to 1 mm. When the 2D graphene ML bends following the contour of a SiC step, it would be unreasonable to expect that pure ballistic transport would persist through the step. Thus, the average dimension of the flat graphene areas (e.g., the width of the terraces) would negatively affect the transport in graphene as long as it is similar to or smaller than the mean free path of the ballistic carriers in flat graphene. This is the case with the samples in FIGS. 4A-4C. If the average dimension of the flat graphene areas is larger than the mean free path then it should not adversely affect carrier transport in graphene (and thus the mobilities would be higher, approaching mobility of graphene on a flat surface). This is the case with the samples in FIGS. 4E and 4F.

In conclusion, the above example shows that the effect of pits on graphene mobility is not very important, as long as there are flat areas between nearest neighbor pits or between pits and terrace edges, whose size is larger than the mean free path of the carriers in 2D graphene. This is the case with pitted samples resulting from the graphenization of SiC with miscut angle of 0.1° or below. What really matters for transport—at least in the directions perpendicular to terrace edges—is the relation of the average dimension of the flat graphene areas (e.g., the width of the terraces) to the mean free path of the ballistic carriers in flat graphene. Transport will be affected when the average terrace width is similar to or smaller than the mean free path of the carrier. If the average dimension of the flat graphene areas is larger than the mean free path then it should not affect adversely the carrier transport in graphene. This correlates the miscut angle of the SiC surface to electrical transport in the overlying graphene, as shown by the fact that graphene grown on pit-free surfaces with narrow terraces, which result from miscut angles lying in the from above 0.1° to 0.5° range, shows substantially lower Hall mobility than graphene grown on surfaces of SiC substrates with miscut angles of 0.1° or below that contain pits. Another important implication of the above example is that one can now eliminate a potentially serious variability factor for graphene performance, which had previously impeded efforts to optimize the graphene growth process and the resulting graphene performance.

While the present disclosure has been particularly shown and described with respect to various embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor structure comprising:
    selecting a SiC substrate having a miscut angle of 0.1° or less; and
    forming a graphene layer on an upper surface of the SiC substrate, wherein said forming the graphene layer includes performing a first anneal in a dilute silane-containing ambient, and performing a second anneal at a temperature from 1400° C. to 1600° C. in an inert ambient.

2. The method of claim 1 wherein said forming the graphene layer further comprises performing an intermediate anneal in another dilute silane-containing ambient at an intermediate temperature between the temperature of the first anneal, and the temperature of the second anneal.

3. The method of claim 1 wherein said SiC substrate has a pit density of less than 5.0 pits/$\mu m^2$ and an average vicinal terrace width of at least 0.5 µm.

4. The method of claim 1 further comprising forming at least one semiconductor device using at least a portion of said graphene layer as an element of said at least one semiconductor device.

5. The method of claim 4 wherein said at least one semiconductor device is a field effect transistor.

6. The method of claim 1 wherein said first and second anneals are performed at a temperature from about 800° C. up to, but not beyond the melting point of silicon.

7. The method of claim 6 wherein said dilute silane-containing ambient comprises at least one compound of hydrogen and silicon that has the general formula $Si_nH_{2n+2}$ wherein n from 1 to 2.

8. The method of claim 7 wherein said dilute silane-containing ambient comprises 20% disilane in He.

9. A semiconductor device comprising:
    a SiC substrate having a miscut angle of 0.1° or less; and
    at least one graphene-containing semiconductor device located atop the SiC substrate, wherein said at least one graphene-containing semiconductor device includes a graphene layer overlying and in contact with an upper surface of the SiC substrate and a field effect transistor located on at least a portion of said graphene layer, said field effect transistor comprising a gate dielectric layer, a gate conductor, a source region and a drain region, wherein said gate dielectric layer has at least a first portion that extends beyond an outermost vertical sidewall of said source region, a second portion that extends beyond an outermost vertical sidewall of said drain region, and a third portion that is located between an innermost vertical sidewall of said source region and an innermost vertical sidewall of said drain region, wherein said gate conductor is in direct contact with said third portion of said gate dielectric layer.

10. The semiconductor device of claim 9 wherein said miscut angle is from 0° to 0.03°.

11. The semiconductor device of claim 9 wherein said graphene layer has an epitaxial relationship to the SiC substrate.

12. The semiconductor device of claim 9 wherein said SiC substrate has an average vicinal terrace width of at least 0.5 µm.

13. The semiconductor device of claim 9 wherein said gate dielectric layer has a fourth portion located atop said source region and a fifth portion located atop said drain region.

14. The semiconductor device of claim 9 wherein said SiC substrate has a pit density of less than 5 pits/$\mu m^2$.

15. The semiconductor device of claim 14 wherein said SiC substrate is 6H SiC.

16. The semiconductor device of claim 14 wherein said SiC substrate is 4H SiC.

* * * * *